(12) United States Patent
Masai et al.

(10) Patent No.: US 8,926,865 B2
(45) Date of Patent: Jan. 6, 2015

(54) WHITE LIGHT-EMITTING GLASS, GLASS-COVERED LIGHT-EMITTING ELEMENT, AND LIGHT-EMITTING DEVICE

(71) Applicants: Kyoto University, Kyoto-shi (JP); Asahi Glass Company, Limited, Chiyoda-ku (JP)

(72) Inventors: Hirokazu Masai, Uji (JP); Toshinobu Yoko, Uji (JP); Takumi Fujiwara, Uji (JP); Syuji Matsumoto, Chiyoda-ku (JP)

(73) Assignees: Kyoto University, Kyoto-shi (JP); Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 13/891,731

(22) Filed: May 10, 2013

(65) Prior Publication Data

US 2013/0241399 A1 Sep. 19, 2013

Related U.S. Application Data

(63) Continuation of application No. PCT/JP2011/006285, filed on Nov. 10, 2011.

(30) Foreign Application Priority Data

Feb. 7, 2011 (JP) .................................. 2011-024190

(51) Int. Cl.
| | |
|---|---|
| *C09K 11/08* | (2006.01) |
| *C09K 11/77* | (2006.01) |
| *H05B 33/12* | (2006.01) |
| *H01L 33/50* | (2010.01) |
| *C03C 4/12* | (2006.01) |
| *C03C 3/16* | (2006.01) |
| *C09K 11/66* | (2006.01) |
| *C03C 3/253* | (2006.01) |

(52) U.S. Cl.
CPC .............. *C03C 4/12* (2013.01); *C09K 11/7717* (2013.01); *C09K 11/7702* (2013.01); *C09K 11/7756* (2013.01); *H05B 33/12* (2013.01); *C09K 11/08* (2013.01); *H01L 33/502* (2013.01); *C09K 11/773* (2013.01); *C03C 3/16* (2013.01); *C09K 11/662* (2013.01); *C03C 3/253* (2013.01); *Y02B 20/181* (2013.01); *C09K 11/7745* (2013.01); *C09K 11/776* (2013.01)
USPC ..................................... 252/301.6 P; 313/503

(58) Field of Classification Search
CPC ..................................... C03C 3/16; C03C 4/12
USPC ........ 252/301.6 P, 301.6 R, 301.4 P; 313/503
See application file for complete search history.

(56) References Cited

U.S. PATENT DOCUMENTS

| | | | |
|---|---|---|---|
| 2,400,147 A | 5/1946 | Hooley | |
| 2008/0032142 A1* | 2/2008 | Tasumi et al. | ................. 428/447 |

FOREIGN PATENT DOCUMENTS

EP 0365235 A2 * 4/1990

(Continued)

OTHER PUBLICATIONS

International Preliminary Report on Patentability issued May 23, 2013 in PCT/JP2011/006285 filed Nov. 10, 2011.

(Continued)

*Primary Examiner* — Nimeshkumar Patel
*Assistant Examiner* — Christopher Raabe
(74) *Attorney, Agent, or Firm* — Oblon, Spivak, McClelland, Maier & Neustadt, L.L.P.

(57) ABSTRACT

A glass emitting white light in itself, and a light-emitting element and a light-emitting device covered with the glass as stated above are provided. The white light-emitting glass is a glass emitting fluorescence at a region having a wavelength of 380 nm to 750 nm by excitation light with a wavelength of 240 nm to 405 nm, not containing crystal, and containing $SnO_x$ (where x=1 to 2, typically x=1 or 2), $P_2O_5$, and $MnO_y$ (where y=1 to 2, typically y=1 or 2). The light-emitting element and the light-emitting device are made up by covering a main surface of a semiconductor light-emitting element with the glass as stated above.

8 Claims, 1 Drawing Sheet

(56) References Cited

FOREIGN PATENT DOCUMENTS

| | | |
|---|---|---|
| JP | 2002-145642 | 5/2002 |
| JP | 2006-265012 | 10/2006 |
| JP | 2008-060428 | 3/2008 |

OTHER PUBLICATIONS

Written Opinion issued Feb. 7, 2012 in PCT/JP2011/006285 filed Nov. 10, 2011.

"A Simple Correction Method for Determination of Absolute Fluorescence Quantum Yields of . . . " by Jun Horigome et al; Bunseki Kagaku vol. 58, No. 6; 2009; pp. 553-559.

"Light EmittingDiode" by Tsunemasa Taguchi; Kogyou Chosakai Publishing Co., ltd.; Apr. 2009; pp. 59-80.

International Search Report Issued Feb. 7, 2012 in PCT/JP2011/006285 filed Nov. 10, 2011.

* cited by examiner

United States Patent US 8,926,865 B2

WHITE LIGHT-EMITTING GLASS, GLASS-COVERED LIGHT-EMITTING ELEMENT, AND LIGHT-EMITTING DEVICE

CROSS-REFERENCE TO RELATED APPLICATIONS

This application is a continuation of prior International Application No. PCT/JP2011/006285, filed on Nov. 10, 2011 which is based upon and claims the benefit of priority from Japanese Patent Applications Nos. 2010-254173 filed on Nov. 12, 2010 and 2011-024190 filed on Feb. 7, 2011; the entire contents of all of which are incorporated herein by reference.

FIELD

The present invention relates to a white light-emitting glass, a glass-covered light-emitting element and light-emitting device, in more detail, to a glass excited by ultraviolet region light (ultraviolet light) and emitting white fluorescence, and to a glass-covered light-emitting element and light-emitting device using the above.

BACKGROUND

In recent years, a light-emitting device emitting white light by making plural kinds of visible light-emitting phosphors emit light while using a light-emitting diode (LED) emitting ultraviolet light or blue wavelength light as an excitation source has been used for a general lighting, a backlight of a liquid-crystal display device, and so on. The phosphor is generally dispersed in a covering material such as a glass and a resin sealing and covering the LED. Besides, the one in which rare-earth ion is contained in the covering material instead of the phosphor has been developed.

However, it is difficult to keep luminance and uniformly disperse the plural kinds of phosphors in the covering material such as the glass. Besides, it is difficult to emit white light only by the rare-earth ion.

SUMMARY

The present inventors found that a glass having a specific composition emits white light in itself by being excited by ultraviolet light. It becomes possible to solve the above-stated problems of the dispersibility of the phosphor and the white light emitting of the rare-earth ion, and in addition, to have advantages of the glass in which it is difficult to be deteriorated resulting from heat, light, moisture, and so on compared to organic materials such as a resin if it is possible to use the glass as stated above as the covering material of the LED.

An object of the present invention is to provide a glass emitting white light in itself useful as a covering material of a light-emitting element for example, and the light-emitting element and a light-emitting device covered with the glass as stated above.

A white light-emitting glass according to an aspect of the present invention is a glass emitting fluorescence at a region having a wavelength of 380 nm to 750 nm by excitation light with a wavelength of 240 nm to 405 nm and not containing a crystal, the glass containing: $SnO_x$ (where x=1 to 2, typically x=1 or 2), $P_2O_5$, ZnO and $MnO_y$ (where y=1 to 2, typically y=1 or 2).

In the white light-emitting glass, a chromaticity coordinating position X of a light-emission color may be 0.22 to 0.40 and a chromaticity coordinating position Y may be 0.25 to 0.35. Herein, the chromaticity coordinating positions X and Y of the light-emission color are values measured based on JIS Z8701.

In the white light-emitting glass, an existence ratio of $MnO_y$ (where y=1 to 2, typically y=1 or 2) may not exceed an existence ratio of $SnO_x$ (where x=1 to 2, typically x=1 or 2).

In the white light-emitting glass, $P_2O_5$: 27.5% to 44.4%, $SnO_x$: 0.1% to 40% (where x=1 to 2, typically x=1 or 2), ZnO: 30% to 71%, and $M_mO_n$: "0" (zero) % to 10% (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) as expressed in mol % on an oxide basis are contained, and further, $MnO_y$ (where y=1 to 2, typically y=1 or 2) may be contained for 0.1% to 2.4% in outer percentage of a total amount of the above-stated components.

In the white light-emitting glass, $P_2O_5$: 27.5% to 40%, $SnO_x$: 20% to 40% (where x=1 to 2, typically x=1 or 2), ZnO: 30% to 48%, and $M_mO_n$: "0" (zero) % to 10% (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) as expressed in mol % on an oxide basis are contained, and further, $MnO_y$ (where y=1 to 2, typically y=1 or 2) may be contained for 0.1% to 2.4% in outer percentage of a total amount of the above-stated components.

In the white light-emitting glass, $P_2O_5$: 35% to 40%, $SnO_x$: 1% to 5% (where x=1 to 2, typically x=1 or 2), ZnO: 50% to 60%, and $M_mO_n$: "0" (zero) % to 10% (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) as expressed in mol % on an oxide basis are contained, and further, $MnO_y$ (where y=1 to 2, typically y=1 or 2) may be contained for 0.1% to 2.4% in outer percentage of a total amount of the above-stated components. The "outer percentage", as used herein, means a proportion when the total amount of respective components except $MnO_y$ is set to be 100.

The white light-emitting glass may be a light-emitting element covering glass.

A glass covering light-emitting element according to an aspect of the present invention includes: a semiconductor light-emitting element; and a cover covering the semiconductor light-emitting element, wherein the cover is made up of the white-light emitting glass.

A light-emitting device according to an aspect of the present invention includes: a substrate; a semiconductor light-emitting element placed on the substrate; and a cover covering the semiconductor light-emitting element, wherein the cover is made up of the white-light emitting glass.

According to the present invention, a glass emitting white light in itself, and a light-emitting element and a light-emitting device covered with the glass as stated above are provided.

DETAILED DESCRIPTION

Hereinafter, embodiments of the present invention will be described.

First Embodiment

A glass according to a first embodiment of the present invention is described. The glass according to the present embodiment contains $P_2O_5$, $SnO_x$ (where x=1 to 2, typically x=1 or 2; hereinafter, it is denoted just as $SnO_x$), ZnO and $MnO_y$ (where y=1 to 2, typically y=1 or 2; hereinafter, it is denoted just as $MnO_y$) as essential components. It is preferable that an existence ratio of $Sn^{2+}$ relative to a total amount of Sn atoms is 5% or more.

$P_2O_5$ being the essential component of the glass is a component stabilizing the glass, and it is preferable that a content thereof is within a range of 27.5 mol % to 44.4 mol %, and preferable to be within a range of 30 mol % to 40 mol %. When the content of $P_2O_5$ is less than 27.5 mol %, there is a possibility that vitrification does not occur, and there is a possibility that water resistance deteriorates when the content exceeds 44.4 mol %.

$SnO_x$ is a component forming a light-emission activator, and a content thereof is preferable to be within a range of 0.1 mol % to 40 mol %. When the content of $SnO_x$ is less than 0.1 mol %, there is a possibility that enough fluorescence cannot be obtained, and when it exceeds 40 mol %, there is a possibility that the glass is easy to be crystallized. It is preferable that $SnO_x$ content is 1 mol % to 20 mol % from a point of view of increasing quantum yield of light-emission, and it is more preferable to be 1 mol % to 5 mol %, and further preferable to be 2 mol % to 4 mol %.

ZnO is a component stabilizing the glass and to obtain high light-emission efficiency, and a content thereof is preferable to be within a range of 30 mol % to 71 mol %. When the ZnO content is less than 30 mol %, the glass becomes unstable or easy to be crystallized. Further, the water resistance may become worse. When it exceeds 71 mol %, there is a possibility that the glass is easy to be crystallized. It is preferable that the ZnO content is 35 mol % to 67 mol % from a point of view of increasing the quantum yield of light-emission, and it is more preferable to be 40 mol % to 65 mol %, and further preferable to be 50.0 mol % to 62.5 mol %.

$MnO_y$ is an essential component to make the glass emit white light, and a content thereof is preferable to be within a range of 0.1 mol % to 2.4 mol % in outer percentage of a total amount of the above-stated each component and later-described other components to be compounded according to need, and more preferable to be within a range of 0.1 mol % to 1.0 mol %. When the content of $MnO_y$ is less than 0.1 mol %, blue becomes strong as a color of the light-emission, and it becomes a light-emission color of reddish when it exceeds 2.4 mol %.

It is possible to further add $M_mO_n$ (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) to the glass according to the present embodiment according to need within a range not disturbing effects of the present invention. Specifically, $TiO_2$, $SiO_2$, $ZrO_2$, $TeO_2$, $GeO_2$, $SeO_2$, $ClO_2$, $B_2O_3$, $Al_2O_3$, $Ga_2O_3$, $Tl_2O_3$, $As_2O_3$, $Bi_2O_3$, $Sb_2O_3$, $Cr_2O_3$, $In_2O_3$, CuO, CdO, NiO, HgO, $SO_2$, $V_2O_5$, $Nb_2O_5$, $Sc_2O_3$, $Y_2O_3$, $La_2O_3$, $Ce_2O_3$, $Pr_6O_{11}$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$ and so on are exemplified.

There are effects such that the crystallization of the glass is suppressed, the glass is stabilized, the water resistance is improved, the glass is stabilized, light taking out efficiency is increased by increasing a reflective index of the glass, the light-emission of the glass is compensated, a light-emission wavelength is adjusted by adding the above-stated components. For example, $B_2O_3$ suppresses the crystallization of the glass. $Al_2O_3$ and $SiO_2$ stabilize the glass. Both $Ga_2O_3$ and $In_2O_3$ improve the water resistance, and stabilize the glass. Besides, the reflective index of the glass is increased and the light taking out efficiency is increased. An oxide of the rare-earth element adjusts the light-emission wavelength.

There is a possibility that the light-emission efficiency deteriorates or the glass becomes unstable if the component is added too much. Accordingly, a content thereof is preferable to be within a range of "0" (zero) mol % to 10 mol %. It is more preferable that the content is within a range of "0" (zero) mol % to 5 mol % from a point of view of softening the glass at a low temperature.

The oxide of the rare-earth element is preferable to be within a range of 3 mol % or less from a point of view of obtaining high light-emission efficiency, more preferable to be within a range of 1 mol % or less, and it is particularly preferable that it is 0.5 mol % or less, further it is not substantially contained. Besides, it is possible to add within a range of 0.05 mol % to 2.0 mol % for an object adjusting the light-emission wavelength.

It is preferable that the glass according to the present embodiment does not substantially contain PbO. Besides, it is preferable that the glass according to the present embodiment does not substantially contain $Li_2O$, $Na_2O$, $K_2O$, and so on. There is a possibility that deterioration caused by ion diffusion to a semiconductor element may occur if these compounds exist in the glass at a significant content. Besides, it is preferable that the glass according to the present embodiment does not substantially contain $Fe_2O_3$, $Co_2O_3$, $WO_3$, and so on. There is a possibility that transparency of the glass is deteriorated because it is colored if these compounds exist in the glass at a significant content.

It is preferable that an existence ratio of $Sn^{2+}$ relative to a total amount of the Sn atoms represented by $SnO_x$ (hereinafter, called also as an Sn-redox) is 5% or more in the glass according to the present embodiment. When the Sn-redox is less than 5%, there is a possibility that the effects of the present invention cannot be fully obtained. It is preferable that the Sn-redox is 75% or more from a point of view of sealing the LED at 600° C. or less.

It is possible to calculate the Sn-redox from measurement results and so on of a Mössbauer spectroscopy. Besides, it is possible to control the Sn-redox by managing a melting atmosphere and/or by mixing a reducing agent into a raw material. Besides, it is also possible to enlarge the Sn-redox by performing heat treatment after the vitrification.

The glass according to the present embodiment is excited by the ultraviolet light, and emits white fluorescence. For example, the glass emits the fluorescence at a region having a wavelength of 380 nm to 750 nm by the excitation light with a wavelength of 240 nm to 405 nm.

Second Embodiment

A glass according to a second embodiment of the present invention is described. The glass according to the present embodiment is a light-emitting glass used as a light-emitting element covering material in a light-emitting device including a semiconductor light-emitting element such as an LED, in particular, it is a light-emitting glass suitable as a light-emitting element covering material of a large-sized light-emitting element and/or a light-emitting element using a light-emission layer laminated substrate of which thermal expansion coefficient is low such as GaN.

This light-emitting glass contains the following as expressed in mol % on an oxide basis:
$P_2O_5$: 27.5% to 40%,
$SnO_x$: 20% to 40%,
ZnO: 30% to 48%, $M_mO_n$: "0" (zero) % to 10% (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more), further, contains $MnO_y$ for 0.1% to 2.4% in outer percentage of a total amount of the above-stated components. A molding property becomes good by having a glass composition as stated above.

$P_2O_5$ is a component stabilizing the glass. When a content of $P_2O_5$ is less than 27.5 mol %, a glass transition point (Tg) becomes high. When the content of $P_2O_5$ exceeds 40 mol %, the water resistance may become worse.

$SnO_x$ is a component forming a light-emission activator, and a component increasing fluidity of the glass. When a content of $SnO_x$ is less than 20 mol %, the glass transition point (Tg) becomes high, and there is a possibility that it is impossible to seal the LED and so on at 600° C. or less. When it exceeds 40 mol %, the thermal expansion coefficient becomes too large, and there is a possibility that the glass cracks when the large-sized light-emitting element or the light-emitting element using the light-emission layer laminated substrate of a material with low expansion coefficient such as GaN is sealed.

ZnO has effects such as increasing the light-emission efficiency, improving the water resistance of the glass, and lowering the thermal expansion coefficient. When a content of ZnO is less than 30 mol %, the thermal expansion coefficient becomes too large, and there is a possibility that the glass cracks when the large-sized light-emitting element or the light-emitting element using the light-emission layer laminated substrate of a material with low thermal expansion coefficient such as GaN is sealed. When the content of ZnO exceeds 48 mol %, there are possibilities that problems such that it is difficult to be vitrified, phase splitting occurs, or it is colored occur.

$M_mO_n$ (where M is the element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) is not essential, but it is possible to have effects such that the crystallization of the glass is suppressed, the glass is stabilized, the water resistance is improved, the glass is stabilized, the light taking out efficiency is increased by increasing the reflective index of the glass, the light-emission of the glass is compensated, the light-emission wavelength is adjusted by adding $M_mO_n$.

As concrete examples of the component, $TiO_2$, $SiO_2$, $ZrO_2$, $TeO_2$, $GeO_2$, $SeO_2$, $ClO_2$, $B_2O_3$, $Al_2O_3$, $Ga_2O_3$, $Tl_2O_3$, $As_2O_3$, $Bi_2O_3$, $Sb_2O_3$, $Cr_2O_3$, $In_2O_3$, CuO, CdO, NiO, HgO, $SO_2$, $V_2O_5$, $Nb_2O_5$, $Sc_2O_3$, $Y_2O_3$, $La_2O_3$, $Ce_2O_3$, $Pr_6O_{11}$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$, and so on are exemplified. For example, $B_2O_3$ suppresses the crystallization of the glass. $Al_2O_3$ and $SiO_2$ stabilize the glass. Both $Ga_2O_3$ and $In_2O_3$ improve the water resistance, and stabilize the glass. Besides, the reflective index of the glass is increased and the light taking out efficiency is increased. The oxide of the rare-earth element adjusts the light-emission wavelength.

There is a possibility that the light-emission efficiency deteriorates or the glass becomes unstable if the component is contained too much. Accordingly, the content thereof is preferable to be within a range of "0" (zero) mol % to 5 mol %. It is more preferable that the content is within a range of 0.5 mol % to 5 mol % from a point of view of weather resistance.

The oxide of the rare-earth element is preferable to be within a range of 3 mol % or less from a point of view of obtaining high light-emission efficiency, more preferable to be within a range of 1 mol % or less, 0.5 mol % or less, further it is particularly preferable that it is not substantially contained. Besides, it is possible to add the oxide within a range of 0.05 mol % to 2.0 mol % for an object adjusting the light-emission wavelength.

$MnO_y$ is an essential component to make the glass emit white light. A content thereof is 0.1 mol % to 2.4 mol % in outer percentage of the total amount of the above-stated each component, and preferable to be 0.1 mol % to 1.0 mol %. When the content of $MnO_y$ is less than 0.1 mol %, blue becomes strong as a color of the light-emission, and it becomes a light-emission color of reddish when it exceeds 2.4 mol %.

It is preferable that the glass according to the present embodiment does not substantially contain PbO. Besides, it is preferable that the glass according to the present embodiment does not substantially contain $Li_2O$, $Na_2O$, $K_2O$, and so on. There is a possibility that deterioration caused by ion diffusion to a semiconductor element may occur if these compounds exist in the glass at a significant content. Besides, it is preferable that the glass according to the present embodiment does not substantially contain $Fe_2O_3$, $Co_2O_3$, $WO_3$, and so on. There is a possibility that transparency of the glass is deteriorated because it is colored if these compounds exist in the glass at a significant content.

It is preferable that an existence ratio of $Sn^{2+}$ relative to a total amount of the Sn atoms represented by $SnO_x$ (Sn-redox) is 5% or more in the glass according to the present embodiment. When the Sn-redox is less than 5%, there is a possibility that the effects of the present invention cannot be fully obtained. It is preferable that the Sn-redox is 75% or more from a point of view of sealing the LED at 600° C. or less.

It is possible to calculate the Sn-redox from measurement results and so on of the Mössbauer spectroscopy. Besides, it is possible to control the Sn-redox by managing the melting atmosphere and/or mixing the reducing agent into the raw material. Besides, it is also possible to enlarge the Sn-redox by performing heat treatment after the vitrification.

Besides, a linear thermal expansion coefficient of the glass according to the present embodiment is $70 \times 10^{-7}/°$ C. to $130 \times 10^{-7}/°$ C., preferable to be $70 \times 10^{-7}/°$ C. to $100 \times 10^{-7}/°$ C., and more preferable to be $70 \times 10^{-7}/°$ C. to $90 \times 10^{-7}/°$ C. When the linear thermal expansion coefficient is less than $70 \times 10^{-7}/°$ C., the glass transition point (Tg) becomes high, and it becomes difficult to seal the LED and so on at 500° C. or less. When the linear thermal expansion coefficient exceeds $130 \times 10^{-7}/°$ C., there is a possibility that cracks occur at a part of the glass which is in contact with the light-emitting element as a starting point at a process cooling the light-emitting element to a room temperature after the element is covered with the glass or at a subsequent process.

The light-emitting glass according to the present embodiment is excited by ultraviolet light, and emits white fluorescence. For example, the glass emits the fluorescence at a region having the wavelength of 380 nm to 750 nm by the excitation light with the wavelength of 240 nm to 405 nm. Besides, the linear thermal expansion coefficient is $70 \times 10^{-7}/°$ C. to $130 \times 10^{-7}/°$ C., and therefore, it is possible to prevent the cracks of the glass at the process cooling the light-emitting element to the room temperature after the element is covered with the glass or at the subsequent process.

Third Embodiment

A glass according to a third embodiment of the present invention is described. The glass according to the present embodiment is a glass suitable for a usage in which high light-emission efficiency is required, and it is used as a light-emitting element covering material at a light-emitting device including a semiconductor light-emitting element such as an LED. In addition, for example, it is possible to use as a material of a lighting fixture taking over a fluorescent light using a conventional phosphor such as a fluorescent light, or as a member enhancing power generating efficiency by laminating on a substrate glass of a solar battery.

This light-emitting glass contains the following as expressed in mol % on an oxide basis:

$P_2O_5$: 35% to 40%,
$SnO_x$: 1% to 5%,
ZnO: 50% to 60%,
$M_mO_n$: "0" (zero) % to 10% (where M is an element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more), further, contains $MnO_y$ for 0.1% to 2.4% in outer percentage of a total amount of the above-stated components. A light-emission color becomes whiter and a quantum yield becomes higher by having a glass composition as stated above.

$P_2O_5$ is a component stabilizing the glass. When a content of $P_2O_5$ is less than 35 mol %, a glass transition point (Tg) becomes high. When the content of $P_2O_5$ exceeds 40 mol %, the water resistance may become worse. $P_2O_5$ is preferable to be 37 mol % to 40 mol %, and more preferable to be 38 mol % to 40 mol %.

$SnO_x$ is a component forming a light-emission activator, and a component increasing the quantum yield of the light-emission. When a content of $SnO_x$ is less than 1 mol %, there is a possibility that enough fluorescence cannot be obtained, and the quantum yield of the light-emission becomes lower if it exceeds 5 mol %. $SnO_x$ is preferable to be 2 mol % to 4 mol %.

ZnO has effects such as increasing the light-emission efficiency, improving the water resistance of the glass, and lowering the thermal expansion coefficient. When a content of ZnO is less than 50 mol %, there is a possibility that enough quantum yield cannot be obtained. When the content of ZnO exceeds 60 mol %, there are possibilities that problems such that it is difficult to be vitrified, phase splitting occurs, or it is colored.

$M_mO_n$ (where M is the element selected from Ti, Zr, V, Nb, Cr, Ni, Cu, B, Al, Si, Cl, Ga, Ge, As, Se, Cd, In, Sb, Te, Hg, Tl, Bi, S and rare-earth elements, and m and n are integers of 1 or more) is not essential, but it is possible to obtain effects such that the crystallization of the glass is suppressed, the glass is stabilized, the water resistance is improved, the glass is stabilized, the light taking out efficiency is increased by increasing the reflective index of the glass, the light-emission of the glass is compensated, the light-emission wavelength is adjusted by adding $M_mO_n$.

As concrete examples of the component, $TiO_2$, $SiO_2$, $ZrO_2$, $TeO_2$, $GeO_2$, $SeO_2$, $ClO_2$, $B_2O_3$, $Al_2O_3$, $Ga_2O_3$, $Tl_2O_3$, $As_2O_3$, $Bi_2O_3$, $Sb_2O_3$, $Cr_2O_3$, $In_2O_3$, CuO, CdO, NiO, HgO, $SO_2$, $V_2O_5$, $Nb_2O_5$, $Sc_2O_3$, $Y_2O_3$, $La_2O_3$, $Ce_2O_3$, $Pr_6O_{11}$, $Nd_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$, and so on can be cited. For example, $B_2O_3$ suppresses the crystallization of the glass. $Al_2O_3$ and $SiO_2$ stabilize the glass. Both $Ga_2O_3$ and $In_2O_3$ improve the water resistance, and stabilize the glass. Besides, the reflective index of the glass is increased and the light taking out efficiency is increased. The oxides of the rare-earth elements adjust the light-emission wavelength.

There is a possibility that the light-emission efficiency deteriorates or the glass becomes unstable if the component is contained too much. Accordingly, the content thereof is preferable to be within a range of "0" (zero) mol % to 5 mol %. It is more preferable that the content is within a range of 0.5 mol % to 5 mol % from a point of view of weather resistance.

The oxide of the rare-earth element is preferable to be within a range of 3 mol % or less from a point of view of obtaining high light-emission efficiency, it is more preferable to be within a range of 1 mol % or less, 0.5 mol % or less, further it is particularly preferable that it is not substantially contained. Besides, it is possible to add within a range of 0.05 mol % to 2.0 mol % for an object adjusting the light-emission wavelength.

$MnO_y$ is an essential component to make the glass emit white light. A content thereof is 0.1 mol % to 2.4 mol % in outer percentage of the total amount of the above-stated each component, and it is preferable to be 0.1 mol % to 1.0 mol %. When the content of $MnO_y$ is less than 0.1 mol %, blue becomes strong as a color of the light-emission, and it becomes a light-emission color of reddish when it exceeds 2.4 mol %.

It is preferable that the glass according to the present embodiment does not substantially contain PbO. Besides, it is preferable that the glass according to the present embodiment does not substantially contain $Li_2O$, $Na_2O$, $K_2O$, and so on. There is a possibility that deterioration caused by ion diffusion to a semiconductor element may occur if these compounds exist in the glass at a significant content. Besides, it is preferable that the glass according to the present embodiment does not substantially contain $Fe_2O_3$, $Co_2O_3$, $WO_3$, and so on. There is a possibility that transparency of the glass is deteriorated because it is colored if these compounds exist in the glass at a significant content.

It is preferable that an existence ratio of $Sn^{2+}$ relative to a total amount of the Sn atoms represented by $SnO_x$ (Sn-redox) is 5% or more in the glass according to the present embodiment. When the Sn-redox is less than 5%, there is a possibility that the effects of the present invention cannot be fully obtained. It is preferable that the Sn-redox is 75% or more from a point of view of sealing the LED at 600° C. or less.

It is possible to calculate the Sn-redox from measurement results and so on of the MÖssbauer spectroscopy. Besides, it is possible to control the Sn-redox by managing the melting atmosphere and/or mixing the reducing agent into the raw material. Besides, it is also possible to enlarge the Sn-redox by performing heat treatment after the vitrification.

The light-emitting glass according to the present embodiment is excited by ultraviolet light, and emits white fluorescence. For example, the glass emits the fluorescence at a region having a wavelength of 380 nm to 750 nm by the excitation light with the wavelength of 240 nm to 405 nm. Besides, the linear thermal expansion coefficient is $70 \times 10^{-7}/°$ C. to $130 \times 10^{-7}/°$ C., and therefore, it is possible to prevent the cracks of the glass at the process cooling the light-emitting element to the room temperature after the element is covered with the glass or at the subsequent process.

Fourth Embodiment

Figure 1:
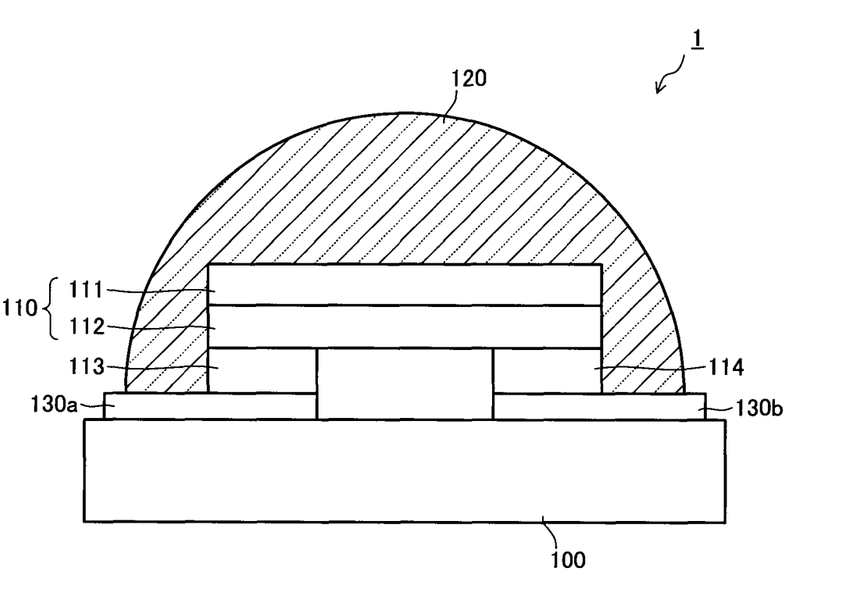
FIG. 1 is a sectional view schematically illustrating a light-emitting device according to an embodiment.

A light-emitting device according to a fourth embodiment of the present invention is described. FIG. 1 is a sectional view schematically illustrating an LED device being an example of the light-emitting device according to the present embodiment.

As illustrated in FIG. 1, an LED device 1 includes a substrate 100, a semiconductor light-emitting element (LED element) 110 placed on the substrate 100, and a covering part 120 covering the semiconductor light-emitting element 110.

Plural wirings 130a, 130b are formed on a surface (main surface) of the substrate 100 at a side where the LED element 110 is placed.

The substrate 100 is, for example, constituted by a rectangular substrate made up of an inorganic material such as alumina of which purity is 98.0% to 99.5% and thickness is 0.2 mm to 1.2 mm. The wirings 130a, 130b formed at the main surface of the substrate 100 may be gold wirings formed by, for example, gold paste.

The LED element 110 includes an element substrate 111 and an LED 112 disposed thereon. A positive electrode 113 and a negative electrode 114 are provided at a side of the LED 112 opposite to the element substrate 111. The LED element 110 is disposed on the substrate 100 such that these electrodes 113, 114 are respectively in contact with the wirings 130a, 130b of the substrate 100.

The LED 112 is an LED emitting ultraviolet light or blue light of which wavelength is 360 nm to 480 nm, and for example, an LED having a quantum well structure where InGaN in which In is added to GaN is used as a light-emitting layer (InGaN based LED) and so on are used. The linear thermal expansion coefficient of the element substrate 111 is, for example, $70 \times 10^{-7}/°C$. to $90 \times 10^{-7}/°C$. In general, a sapphire substrate of which linear expansion coefficient is $80 \times 10^{-7}/°C$. is used for the element substrate 111, but it may be a substrate of SiC, GaN, AlN, and so on.

The covering part 120 is made up of a covering material, and the covering material is formed of the glass having the above-stated composition.

In the light-emitting device 1 according to the present embodiment, the LED element 110 is covered with the glass emitting white fluorescence excited by the ultraviolet light emitted from the LED element 110. Accordingly, it is possible to solve problems of a conventional light-emitting device in which a phosphor is dispersed and a light-emitting device using a covering material containing only rare-earth ion as the light-emitting activator, and it is possible to obtain a light-emitting device with high luminance, white light-emitting, and good characteristics.

In particular, when the light-emitting glass according to the second embodiment is used, it is possible to make a difference of the thermal expansion coefficient with the LED element 110 small, and to prevent the occurrence of cracks of the covering part 120 and so on resulting from the thermal expansion coefficient difference.

Note that the present invention is not limited to the description of the embodiments explained hereinabove, and it is possible to appropriately add changes and modifications without departing from the spirit of the present invention.

EXAMPLES

Next, the present invention is described in more detail by using examples, but the present invention is not limited to these examples.

Example 1

$(NH_4)_2HPO_4$, SnO, ZnO, and MnO were weighted so that the composition of the glass becomes $P_2O_5$: 40.0%, $SnO_x$: 2.5%, ZnO: 57.5%, and $MnO_y$: 0.1% (outer percentage) in mol % on an oxide basis. $(NH_4)_2HPO_4$ and ZnO were then mixed from among these weighted raw materials, this mixture was put into an alumina $(Al_2O_3)$ crucible, and it was heat treated at 800° C. for 12 hours (heat treatment (I)). An obtained glass precursor was put into a mortar, and it was mixed with SnO and MnO being remaining materials. This mixture was put into the alumina $(Al_2O_3)$ crucible, it was placed in an atmosphere, and it is melted at 1100° C. for 30 minutes (heat treatment (II)), press quenching was performed on a steel sheet heated to 200° C., to obtain a glass. Distortion removal, cutting, mirror polishing were performed for the obtained glass to make it a test sample.

Examples 2 to 10

Glasses according to examples 2 to 10 were obtained as same as the example 1 except that respective raw materials were weighted so that composition ratios of the glasses became compositions as illustrated in Table 1, and further, the alumina $(Al_2O_3)$ crucible was changed into a platinum (Pt) crucible in examples 7 to 10. The distortion removal, the cutting, the mirror polishing were performed for the obtained glasses to make them test samples.

Examples 11 to 35

Glasses according to examples 11 to 35 were obtained as same as the example 1 except that respective raw materials were weighted so that composition ratios of the glasses became compositions as illustrated in Table 2 to Table 4, and conditions of the heat treatment (I) and the heat treatment (II) (a kind of the crucible, a heat treatment temperature, and a heat treatment time) were changed as illustrated in Tables 2 to 4 (note that examples 21 and 22 were not vitrified). The distortion removal, the cutting, the mirror polishing were performed for the obtained glasses to make them test samples.

Examples 36 to 60

Glasses according to examples 36 to 60 were obtained as same as the example 1 except that respective materials were weighted so that composition ratios of the glasses become compositions as illustrated in Table 5 to Table 7. The distortion removal, the cutting, the mirror polishing were performed for the obtained glasses to make them test samples.

Vitrification was verified by visual observation as for the glasses obtained in the above-stated examples 1 to 60. The one which became transparent at a whole area was set to be "a", the one in which transparent part and opaque part were mixed was set to be "b", and the one which became opaque at the whole area and the one representing deliquescence was set to be "c" in the obtained samples. These results are illustrated in Table 1 to Table 7.

Besides, fluorescence and excitation spectra were measured by using a spectro-fluorometer (manufactured by Shimadzu Corporation RF-5300PC) as for the glasses obtained in the examples 1 to 10, 12 to 15, 17 to 20, and 23 to 60. As a result, the light-emission by the ultraviolet excitation light was verified at all of the glasses. Besides, the quantum yield and emission chromaticity were measured and evaluated as for each of these glasses. Measurement and evaluation methods of the quantum yield and the emission chromaticity are as follows. These results are also illustrated in Table 1 to Table 7. Note that a "-" mark in a measurement and evaluation field in Table 1 to Table 7 means that the measurement, the evaluation, and so on are not performed yet. Besides, a numerical value in a composition field in Table 1 to Table 7 represents an oxide amount in the glass converted from the oxide of the raw material.

[Quantum Yield]

Normalized quantum yield is measured and evaluated according to the following procedure by using an Absolute PL quantum yield measurement system (manufactured by Hamamatsu Photonics K.K. model number: C9920-02).

(1) An excitation light spectrum (integrated intensity $E_{g0}$) is measured under an empty state where a sample is not put into a sample chamber (measurement of a background, ±2 nm relative to a center wavelength). Next, the measurement sample is placed at the sample chamber, an excitation light spectrum (integrated intensity $E_{g1}$) and a light-emission spectrum (integrated intensity $P_g$) are measured, and a photon number ($\Delta E_g$) absorbed in the measurement sample is calculated by the following expression.

$$\Delta E_g = E_{g0} - E_{g1}$$

(2) After a background is measured (an excitation light spectrum (integrated intensity $E_{s0}$)) as same as the (1), an authentic sample (MgWO$_4$: manufactured by Koj undo Chemical Laboratory Co., Ltd., purity 3N) is placed at a measurement sample chamber, an excitation light spectrum (integrated intensity $E_{s1}$) and a light-emission spectrum (integrated intensity $P_s$) are measured, and a photon number ($\Delta E_s$) absorbed in the authentic sample is calculated by the following expression.

$$\Delta E_s = E_{s0} - E_{s1}$$

(3) Normalized quantum yield (NQE) is calculated by the following expression.

$$NQE = [(P_g \cdot \Delta E_g)/(P_s \cdot \Delta E_s)] \times 100$$

The normalized quantum yield measured as stated above is a relative quantum yield based on a quantum yield at 254 nm of MgWO$_4$ which is actually used, and it is possible to simply evaluate a high quantum yield compared to a quantum yield measured by a normal method. Namely, there is a case when a value exceeding 100% is represented on appearance caused by a difference of optical paths and so on depending on presence/absence of the sample when the quantum yield near 100% is measured in the normal measurement. However, it is impossible that a true value exceeds 100%, and therefore, it is difficult to treat the value as a quantitative evaluation. On the other hand, the value is evaluated by a relative value based on a quantum yield value of a high quantum yield substance which is already known and typical in the normalized quantum yield, and therefore, a conflict value resulting from experimental circumstances is not represented. Note that it is known that the quantum yield of MgWO$_4$ used as the authentic sample is 80% or more (BUNSEKI KAGAKU Vol. 58 (2009), No. 6, pp 553 to 559).

It is preferable that the normalized quantum yield of the light-emitting glass according to the present invention is 60% or more, more preferable to be 70% or more, further more preferable to be 80% or more, and particularly preferable to be 90% or more from a point of view of being used as a fluorescent conversion material for illumination and light source.

[Emission Chromaticity]

Values of X and Y in chromaticity coordinates are calculated and evaluated from an analysis of a fluorescence spectrum. A calculation method follows a calculation method of a CIE chromaticity diagram according to a standard of a Commission International de l'Eclairage. This method is based on JIS Z8701.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Composition (mol %) | SnO$_x$ | 2.5 | 2.5 | 2.5 | 2.5 | 2.5 | 2.5 | 2.5 | 2.5 | 2.5 | 2.5 |
| | P$_2$O$_5$ | 40.0 | 40.0 | 40.0 | 40.0 | 40.0 | 40.0 | 40.0 | 40.0 | 40.0 | 40.0 |
| | ZnO | 57.5 | 57.5 | 57.5 | 57.5 | 57.5 | 57.5 | 57.5 | 57.5 | 57.5 | 57.5 |
| | MnO$_y$ | 0.10 | 0.30 | 0.50 | 0.70 | 1.00 | 2.00 | 0.30 | 0.50 | 0.70 | 1.00 |
| | MgO | — | — | — | — | — | — | — | — | — | — |
| | CaO | — | — | — | — | — | — | — | — | — | — |
| | SrO | — | — | — | — | — | — | — | — | — | — |
| | BaO | — | — | — | — | — | — | — | — | — | — |
| | GeO$_2$ | — | — | — | — | — | — | — | — | — | — |
| | CeO$_2$ | — | — | — | — | — | — | — | — | — | — |
| Heat Treatment (I) | Temperature (° C.) | 800 | 800 | 800 | 800 | 800 | 800 | 800 | 800 | 800 | 800 |
| | Time (hr) | 12 | 12 | 12 | 12 | 12 | 12 | 12 | 12 | 12 | 12 |
| | Crucible Material | Al$_2$O$_3$ | Al$_2$O$_3$ | Al$_2$O$_3$ | Al$_2$O$_3$ | Al$_2$O$_3$ | Al$_2$O$_3$ | Pt | Pt | Pt | Pt |
| Heat Treatment (II) | Temperature (° C.) | 1100 | 1100 | 1100 | 1100 | 1100 | 1100 | 1100 | 1100 | 1100 | 1100 |
| | Time (hr) | 30 | 30 | 30 | 30 | 30 | 30 | 30 | 30 | 30 | 30 |
| | Crucible Material | Al$_2$O$_3$ | Al$_2$O$_3$ | Al$_2$O$_3$ | Al$_2$O$_3$ | Al$_2$O$_3$ | Al$_2$O$_3$ | Pt | Pt | Pt | Pt |
| Measurement, Evaluation | Vitrification | a | a | a | a | a | a | a | a | a | a |
| | Normalized Quantum Yield (%) | 97.5 | 86.4 | 82.7 | 93.2 | 84.6 | 81.7 | 92.7 | 94.7 | 89.8 | 90.9 |
| | Excitation Wavelength (nm) | 254 | 254 | 254 | 254 | 254 | 254 | 254 | 254 | 254 | 254 |
| | Chromaticity Cordinates X | 0.237 | 0.260 | 0.279 | 0.306 | 0.324 | 0.389 | 0.250 | 0.282 | 0.309 | 0.335 |
| | Y | 0.268 | 0.285 | 0.293 | 0.308 | 0.313 | 0.334 | 0.279 | 0.295 | 0.307 | 0.319 |

TABLE 2

| | | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Composition | SnO$_x$ | 40.0 | 1.0 | 25.0 | 1.0 | 5.1 | 30.0 | 2.5 | 2.5 | 2.5 | 2.5 |
| | P$_2$O$_5$ | 30.0 | 28.0 | 27.5 | 44.0 | 44.4 | 40.0 | 37.5 | 37.5 | 35.0 | 35.0 |

TABLE 2-continued

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| (mol %) | ZnO | 30.0 | 71.0 | 70.0 | 55.0 | 50.5 | 30.0 | 60.0 | 60.0 | 62.5 | 62.5 |
|  | $MnO_y$ | 0.50 | 0.50 | 0.50 | 0.50 | 0.50 | 0.50 | 0.50 | 0.25 | 0.50 | 0.25 |
|  | MgO | — | — | — | — | — | — | — | — | — | — |
|  | CaO | — | — | — | — | — | — | — | — | — | — |
|  | SrO | — | — | — | — | — | — | — | — | — | — |
|  | BaO | — | — | — | — | — | — | — | — | — | — |
|  | $GeO_2$ | — | — | — | — | — | — | — | — | — | — |
|  | $CeO_2$ | — | — | — | — | — | — | — | — | — | — |
| Heat Treatment (I) | Temperature (° C.) | 800 | 800 | 800 | 800 | 800 | 800 | 800 | 800 | 800 | 800 |
|  | Time (hr) | 12 | 12 | 12 | 12 | 12 | 12 | 3 | 3 | 3 | 3 |
|  | Crucible Material | $Al_2O_3$ | $Al_2O_3$ | $Al_2O_3$ | $Al_2O_3$ | $Al_2O_3$ | $Al_2O_3$ | Pt | Pt | Pt | Pt |
| Heat Treatment (II) | Temperature (° C.) | 1100 | 1100 | 1100 | 1100 | 1100 | 1100 | 1100 | 1100 | 1100 | 1100 |
|  | Time (hr) | 30 | 30 | 30 | 30 | 30 | 30 | 30 | 30 | 30 | 30 |
|  | Crucible Material | $Al_2O_3$ | $Al_2O_3$ | $Al_2O_3$ | $Al_2O_3$ | $Al_2O_3$ | $Al_2O_3$ | Pt | Pt | Pt | Pt |
| Measurement, Evaluation | Vitrification | b | a | a | a | a | b | a | a | a | a |
|  | Normalized Quantum Yield (%) | — | 73.7 | 60.3 | 110.5 | 96.7 | — | 94.7 | 84.3 | 90.4 | 87.2 |
|  | Excitation Wavelength (nm) | — | 254 | 254 | 254 | 254 | — | 254 | 254 | 254 | 254 |
|  | Chromaticity   X | — | 0.307 | 0.298 | 0.273 | 0.281 | — | 0.283 | 0.247 | 0.286 | 0.250 |
|  | Cordinates      Y | — | 0.283 | 0.278 | 0.303 | 0.312 | — | 0.283 | 0.260 | 0.277 | 0.256 |

TABLE 3

|  |  | Example 21 | Example 22 | Example 23 | Example 24 | Example 25 | Example 26 | Example 27 |
|---|---|---|---|---|---|---|---|---|
| Composition (mol %) | $SnO_x$ | 1.0 | 5.0 | 1.0 | 2.5 | 2.5 | 5.0 | 2.5 |
|  | $P_2O_5$ | 27.0 | 45.0 | 40.0 | 40.0 | 40.0 | 40.0 | 40.0 |
|  | ZnO | 72 | 50.0 | 59.0 | 57.5 | 57.5 | 55.0 | 55.0 |
|  | $MnO_y$ | 0.5 | 0.5 | — | — | — | — | — |
|  | MgO | — | — | — | — | — | — | 2.5 |
|  | CaO | — | — | — | — | — | — | — |
|  | SrO | — | — | — | — | — | — | — |
|  | BaO | — | — | — | — | — | — | — |
|  | $GeO_2$ | — | — | — | — | — | — | — |
|  | $CeO_2$ | — | — | — | — | — | — | — |
| Heat Treatment (I) | Temperature (° C.) | 800 | 800 | 800 | 800 | 800 | 300 | 300 |
|  | Time (hr) | 12 | 12 | 12 | 12 | 12 | 12 | 12 |
|  | Crucible Material | $Al_2O_3$ | $Al_2O_3$ | $SiO_2$ | $SiO_2$ | Au | $Al_2O_3$ | $Al_2O_3$ |
| Heat Treatment (II) | Temperature (° C.) | 1100 | 1100 | 1100 | 1100 | 1100 | 1100 | 1100 |
|  | Time (hr) | 30 | 30 | 30 | 30 | 30 | 30 | 30 |
|  | Crucible Material | $Al_2O_3$ | $Al_2O_3$ | $SiO_2$ | $SiO_2$ | Pt | $Al_2O_3$ | $Al_2O_3$ |
| Measurement, Evaluation | Vitrification | c | c | a | a | a | a | a |
|  | Normalized Quantum Yield (%) | — | — | 80.0 | 96.0 | 98.6 | 85.2 | 79.6 |
|  | Excitation Wavelength (nm) | — | — | 262 | 278 | 275 | 287 | 275 |
|  | Chromaticity   X | — | — | 0.213 | 0.195 | 0.197 | 0.191 | 0.198 |
|  | Cordinates      Y | — | — | 0.244 | 0.196 | 0.202 | 0.185 | 0.205 |

TABLE 4

|  |  | Example 28 | Example 29 | Example 30 | Example 31 | Example 32 | Example 33 | Example 34 | Example 35 |
|---|---|---|---|---|---|---|---|---|---|
| Composition (mol %) | $SnO_x$ | 2.5 | 2.5 | 2.5 | 2.5 | 2.5 | 2.5 | 2.5 | 2.5 |
|  | $P_2O_5$ | 40.0 | 40.0 | 40.0 | 40.0 | 40.0 | 40.0 | 40.0 | 40.0 |
|  | ZnO | 55.0 | 55.0 | 55.0 | 55.0 | 55.0 | 55.0 | 55.0 | 57.5 |
|  | $MnO_y$ | — | — | — | — | — | 2.5 | 2.5 | — |
|  | MgO | — | — | — | — | — | — | — | — |
|  | CaO | 2.5 | — | — | — | — | — | — | — |
|  | SrO | — | 2.5 | — | — | — | — | — | — |
|  | BaO | — | — | 2.5 | — | — | — | — | — |
|  | $GeO_2$ | — | — | — | 2.5 | — | — | — | — |
|  | $CeO_2$ | — | — | — | — | 2.5 | — | — | — |

TABLE 4-continued

|  |  | Example 28 | Example 29 | Example 30 | Example 31 | Example 32 | Example 33 | Example 34 | Example 35 |
| --- | --- | --- | --- | --- | --- | --- | --- | --- | --- |
| Heat Treatment (I) | Temperature (° C.) | 300 | 300 | 300 | 300 | 300 | 300 | 300 | 300 |
|  | Time (hr) | 12 | 12 | 12 | 12 | 12 | 12 | 12 | 12 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Heat Treatment (II) | Temperature (° C.) | 1100 | 1100 | 1100 | 1100 | 1100 | 1100 | 1100 | 1100 |
|  | Time (hr) | 30 | 30 | 30 | 30 | 30 | 30 | 30 | 30 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Measurement, Evaluation | Vitrification | a | a | a | a | a | a | a | a |
|  | Normalized Quantum Yield (%) | 89.4 | 73.8 | 90.0 | 96.3 | 16.0 | 87.9 | 92.9 | 95.4 |
|  | Excitation Wavelength (nm) | 269 | 265 | 268 | 277 | 267 | 254 | 256 | 284 |
|  | Chromaticity X | 0.213 | 0.215 | 0.211 | 0.201 | 0.209 | 0.435 | 0.433 | 0.188 |
|  | Cordinates Y | 0.238 | 0.244 | 0.233 | 0.206 | 0.223 | 0.354 | 0.351 | 0.179 |

TABLE 5

|  |  | Example 36 | Example 37 | Example 38 | Example 39 | Example 40 | Example 41 | Example 42 | Example 43 | Example 44 |
| --- | --- | --- | --- | --- | --- | --- | --- | --- | --- | --- |
| Composition (mol %) | $SnO_x$ | 2.5 | 2.5 | 2.5 | 2.5 | 2.5 | 2.5 | 2.5 | 2.5 | 2.5 |
|  | $P_2O_5$ | 40.0 | 40.0 | 40.0 | 40.0 | 40.0 | 40.0 | 40.0 | 40.0 | 40.0 |
|  | ZnO | 57.5 | 57.5 | 57.5 | 57.5 | 57.5 | 57.5 | 57.5 | 57.5 | 57.5 |
|  | $MnO_y$ | 0.5 | 0.5 | 0.5 | 0.5 | 0.5 | 0.5 | 0.5 | 0.5 | 0.5 |
|  | $La_2O_3$ | 1.0 | — | — | — | — | — | — | — | — |
|  | $CeO_2$ | — | 2.0 | — | — | — | — | — | — | — |
|  | $Pr_6O_{11}$ | — | — | 0.33 | — | — | — | — | — | — |
|  | $Nd_2O_3$ | — | — | — | 1.0 | — | — | — | — | — |
|  | $Sm_2O_3$ | — | — | — | — | 1.0 | — | — | — | — |
|  | $Eu_2O_3$ | — | — | — | — | — | 1.0 | — | — | — |
|  | $Gd_2O_3$ | — | — | — | — | — | — | 1.0 | — | — |
|  | $Tb_2O_7$ | — | — | — | — | — | — | — | 0.5 | — |
|  | $Dy_2O_3$ | — | — | — | — | — | — | — | — | 1.0 |
|  | $Ho_2O_3$ | — | — | — | — | — | — | — | — | — |
|  | $Er_2O_3$ | — | — | — | — | — | — | — | — | — |
|  | $Tm_2O_3$ | — | — | — | — | — | — | — | — | — |
|  | $Yb_2O_3$ | — | — | — | — | — | — | — | — | — |
| Heat Treatment (I) | Temperature (° C.) | 800 | 800 | 800 | 800 | 800 | 800 | 800 | 800 | 800 |
|  | Time (hr) | 12 | 12 | 12 | 12 | 12 | 12 | 12 | 12 | 12 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Heat Treatment (II) | Temperature (° C.) | 1100 | 1100 | 1100 | 1100 | 1100 | 1100 | 1100 | 1100 | 1100 |
|  | Time (hr) | 30 | 30 | 30 | 30 | 30 | 30 | 30 | 30 | 30 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Measurement, Evaluation | Vitrification | a | a | a | a | a | a | a | a | a |
|  | Normalized Quantum Yield (%) | 85 | 12 | 17 | 28 | 45 | 23 | 88 | 68 | 55 |
|  | Excitation Wavelength (nm) | 254 | 254 | 254 | 254 | 254 | 254 | 254 | 254 | 254 |
|  | Chromaticity X | 0.269 | 0.387 | 0.277 | 0.192 | 0.324 | 0.388 | 0.281 | 0.320 | 0.298 |
|  | Cordinates Y | 0.279 | 0.337 | 0.330 | 0.146 | 0.309 | 0.309 | 0.285 | 0.416 | 0.326 |

TABLE 6

|  |  | Example 45 | Example 46 | Example 47 | Example 48 | Example 49 | Example 50 | Example 51 | Example 52 |
| --- | --- | --- | --- | --- | --- | --- | --- | --- | --- |
| Composition (mol %) | $SnO_x$ | 2.5 | 2.5 | 2.5 | 2.5 | 2.5 | 2.5 | 2.5 | 2.5 |
|  | $P_2O_5$ | 40.0 | 40.0 | 40.0 | 40.0 | 40.0 | 40.0 | 40.0 | 40.0 |
|  | ZnO | 57.5 | 57.5 | 57.5 | 57.5 | 57.5 | 57.5 | 57.5 | 57.5 |
|  | $MnO_y$ | 0.5 | 0.5 | 0.5 | 0.5 | 0.5 | 0.5 | 0.5 | 0.5 |
|  | $La_2O_3$ | — | — | — | — | — | — | — | — |
|  | $CeO_2$ | — | — | — | — | — | — | — | — |
|  | $Pr_6O_{11}$ | — | — | — | — | — | — | — | — |
|  | $Nd_2O_3$ | — | — | — | — | — | — | — | — |
|  | $Sm_2Od$ | — | — | — | — | — | — | — | — |
|  | $Eu_2O_3$ | — | — | — | — | — | — | — | — |
|  | $Gd_2O_3$ | — | — | — | — | — | — | — | — |
|  | $Tb_4O_7$ | — | — | — | — | 0.05 | 0.25 | 1.0 | 0.005 |
|  | $Dy_2O_3$ | — | — | — | — | — | — | — | — |
|  | $Ho_2O_3$ | 1.0 | — | — | — | — | — | — | — |
|  | $Er_2O_3$ | — | 1.0 | — | — | — | — | — | — |
|  | $Tm_2O_3$ | — | — | 1.0 | — | — | — | — | — |
|  | $Yb_2O_3$ | — | — | — | 1.0 | — | — | — | — |

TABLE 6-continued

|  |  | Example 45 | Example 46 | Example 47 | Example 48 | Example 49 | Example 50 | Example 51 | Example 52 |
|---|---|---|---|---|---|---|---|---|---|
| Heat Treatment (I) | Temperature (° C.) | 800 | 800 | 800 | 800 | 800 | 800 | 800 | 800 |
|  | Time (hr) | 12 | 12 | 12 | 12 | 12 | 12 | 12 | 12 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Heat Treatment (II) | Temperature (° C.) | 1100 | 1100 | 1100 | 1100 | 1100 | 1100 | 1100 | 1100 |
|  | Time (hr) | 30 | 30 | 30 | 30 | 30 | 30 | 30 | 30 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Measurement, Evaluation | Vitrification | a | a | a | a | a | a | a | a |
|  | Normalized Quantum Yield (%) | 20 | 20 | 45 | 69 | 88 | 77 | 57 | 89 |
|  | Excitation Wavelength (nm) | 254 | 254 | 254 | 254 | 254 | 254 | 254 | 254 |
|  | Chromaticity X | 0.311 | 0.262 | 0.238 | 0.252 | 0.271 | 0.293 | 0.353 | 0.275 |
|  | Cordinates Y | 0.345 | 0.233 | 0.256 | 0.270 | 0.294 | 0.352 | 0.512 | 0.290 |

TABLE 7

|  |  | Example 53 | Example 54 | Example 55 | Example 56 | Example 57 | Example 58 | Example 59 | Example 60 |
|---|---|---|---|---|---|---|---|---|---|
| Composition (mol %) | $SnO_x$ | 2.5 | 2.5 | 2.5 | 2.5 | 2.5 | 2.5 | 2.5 | 2.5 |
|  | $P_2O_5$ | 40.0 | 40.0 | 40.0 | 40.0 | 40.0 | 40.0 | 40.0 | 40.0 |
|  | ZnO | 57.5 | 57.5 | 57.5 | 57.5 | 57.5 | 57.5 | 57.5 | 57.5 |
|  | $MnO_y$ | 0.5 | 0.5 | 0.5 | 0.5 | 2.0 | 2.0 | 2.0 | 0.5 |
|  | $La_2O_3$ | — | — | — | — | — | — | — | — |
|  | $CeO_2$ | — | — | — | — | — | — | — | — |
|  | $Pr_6O_{11}$ | — | — | — | — | — | — | — | — |
|  | $Nd_2O_3$ | — | — | — | — | — | — | — | — |
|  | $Sm_2Od$ | — | — | — | — | — | — | — | — |
|  | $Eu_2O_3$ | 0.1 | 0.5 | 2.0 | 0.01 | — | 1.0 | — | — |
|  | $Gd_2O_3$ | — | — | — | — | — | — | — | — |
|  | $Tb_4O_7$ | — | — | — | — | 0.5 | — | — | — |
|  | $Dy_2O_3$ | — | — | — | — | — | — | 1.0 | 0.1 |
|  | $Ho_2O_3$ | — | — | — | — | — | — | — | — |
|  | $Er_2O_3$ | — | — | — | — | — | — | — | — |
|  | $Tm_2O_3$ | — | — | — | — | — | — | — | — |
|  | $Yb_2O_3$ | — | — | — | — | — | — | — | — |
| Heat Treatment (I) | Temperature (° C.) | 800 | 800 | 800 | 800 | 800 | 800 | 800 | 800 |
|  | Time (hr) | 12 | 12 | 12 | 12 | 12 | 12 | 12 | 12 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Heat Treatment (II) | Temperature (° C.) | 1100 | 1100 | 1100 | 1100 | 1100 | 1100 | 1100 | 1100 |
|  | Time (hr) | 30 | 30 | 30 | 30 | 30 | 30 | 30 | 30 |
|  | Crucible Material | $Al_2O_3$ | $Al_2O_3$ | $Al_2O_3$ | $Al_2O_3$ | $Al_2O_3$ | $Al_2O_3$ | $Al_2O_3$ | $Al_2O_3$ |
| Measurement, Evaluation | Vitrification | a | a | a | a | a | a | a | a |
|  | Normalized Quantum Yield (%) | 63 | 34 | 12 | 88 | 54 | 14 | 35 | 58 |
|  | Excitation Wavelength (nm) | 254 | 254 | 254 | 254 | 254 | 254 | 254 | 254 |
|  | Chromaticity X | 0.293 | 0.353 | 0.493 | 0.273 | 0.414 | 0.453 | 0.378 | 0.258 |
|  | Cordinates Y | 0.290 | 0.300 | 0.318 | 0.287 | 0.405 | 0.314 | 0.350 | 0.302 |

As it is obvious from Table 1 to Table 7, the light-emission color is blue in each of the examples 23 to 32 and 35 where Mn is not contained. On the other hand, the white light-emission is obtained in each of the examples 1 to 20 where Mn is contained for 0.1 mol % to 2.4 mol % as $MnO_y$. It is verified that Mn is an important component to have both the high quantum yield and the white light-emission. Besides, Sn being a component of the glass according to the present embodiment is scattered a lot as $Sn^{2+}$, and it is conceivable that $Sn^{2+}$ is the light-emission activator. Normally, the light emission of $Sn^{2+}$ is blue or pale, but it is estimated that a color tone is changed into white by adding modulation to an energy level relating to the light-emission of $Sn^{2+}$ by adding Mn.

Further, it colored red in each of the examples 33 and 34 where the Mn amount was set to be 2.5 mol % (as $MnO_y$). It is estimated that the red light-emission peculiar to $Mn^{2+}$ becomes obvious because a light-emission wavelength of $Mn^{2+}$ is normally red, and existence of $Mn^{2+}$ exceeds a content of $Sn^{2+}$. Namely, an existence ratio of $Sn^{2+}$ relative to all of Sn atoms in each of the glasses of the examples 33 and 34 is approximately 90%, and therefore, an existence ratio as SnO becomes approximately 2.3%. On the other hand, an existence ratio of $Mn^{2+}$ relative to all of Mn atoms in each of the glasses of the examples 33 and 34 is approximately 2.5%, and it is conceivable that $Mn^{2+}$ exists more than the existence ratio of $Sn^{2+}$, and therefore, the red light-emission peculiar to $Mn^{2+}$ is mixed. The example 33 is an example using an MnO raw material as an Mn source, and the example 34 is an example using an $MnO_2$ raw material as the Mn source, but Mn exists as $MnO_y$ in both of the examples 33 and 34, and it is estimated that almost all of them are MnO. Mn in the $MnO_2$ raw material exists as $Mn^{4+}$, but it is conceivable that it becomes $Mn^{2+}$ caused by a reduction reaction occurred during the glass melts. As a result, it is conceivable that a difference in optical characteristics is very little of the examples 33, 34.

Besides, in the example 36 to the example 60 in which various kinds of rare-earth oxides were added for the example 3 in outer percentage, different color tones were respectively represented depending on the kinds of the rare-earths. There was a tendency in the color tone in which the color departing from the example 3 was represented as an addition concentration was higher. For example, $Dy_2O_3$ was contained for 1.0% in the example 59, for 0.1% in the example 60, and the color of the example 59 of which concentration was higher get away from the example 3 in the chromaticity coordinate and became near a bulb color in orange. It was verified that it was possible to make emit light in various color tones centering on white by adjusting the kinds and the concentrations of the rare-earth oxides to be added. In addition, the normalized quantum yield higher than the example 3 could be obtained in each of the example 36 in which $La_2O_3$ is added for 1.0%, the example 42 in which $Gd_2O_3$ is added for 1.0%, the example 49 in which $Tb_4O_7$ is added for 0.05%, the example 52 in which $Tb_4O_7$ is added for 0.005%, and the example 56 in which $Eu_2O_3$ is added for 0.01% to the example 3.

A light-emitting glass according to the present invention is able to be used for covering and sealing of an LED element used for a backlight light source of a liquid-crystal display device, a general lighting, a headlight for a vehicle, and so on. Besides, it is also possible to be used as a material of a lighting fixture superseding a conventional fluorescent light, a member increasing a power generating efficiency of a substrate glass of a solar battery, and so on.

What is claimed is:

1. A white light-emitting glass emitting fluorescence at a region having a wavelength of 380 nm to 750 nm by excitation light with a wavelength of 240 nm to 405 nm and not containing a crystal, the glass consisting essentially of:
   from 27.5% to 44.4% of $P_2O_5$;
   from 0.1% to 40% of $SnO_x$;
   from 30% to 71% of ZnO;
   from 0% to 10% of $M_mO_n$; and
   from 0.1% to 2.4% of $MnO_y$,
   percentages being based on a total amount of the above-stated components expressed in mol % on an oxide basis,
   wherein:
   x=1 to 2;
   y=1 to 2;
   M is an element selected from the group consisting of Ti, Zr, V, Nb, Cr, Ni, Cu, B, Al, Si, Cl, Ga, Ge, As, Se, Cd, In, Sb, Te, Hg, Tl, Bi, S and a rare-earth element;
   m and n are independently integers of 1 or more; and
   the glass does not substantially contain $Li_2O$, $Na_2O$ and $K_2O$.

2. The white light-emitting glass according to claim 1, wherein a chromaticity coordinating position X of a light-emission color is 0.22 to 0.40 and a chromaticity coordinating position Y is 0.25 to 0.35.

3. The white light-emitting glass according to claim 1, wherein an existence ratio of the $MnO_y$ does not exceed an existence ratio of the $SnO_x$.

4. The white light-emitting glass according to claim 1, containing:
   from 27.5% to 40% of the $P_2O_5$;
   from 20% to 40% of the $SnO_x$;
   from 30% to 48% of the ZnO; and
   from 0% to 10% of the $M_mO_n$.

5. The white light-emitting glass according to claim 1, containing:
   from 35% to 40% of the $P_2O_5$;
   from 1% to 5% of the $SnO_x$;
   from 50% to 60% of the ZnO; and
   from 0% 10% of the $M_mO_n$.

6. The white light-emitting glass according to claim 1, which is a light-emitting element covering glass.

7. The white light-emitting glass according to claim 1, wherein x=1 or 2.

8. The white light-emitting glass according to claim 1, wherein y=1 or 2.

* * * * *

UNITED STATES PATENT AND TRADEMARK OFFICE
CERTIFICATE OF CORRECTION

PATENT NO. : 8,926,865 B2
APPLICATION NO. : 13/891731
DATED : January 6, 2015
INVENTOR(S) : Hirokazu Masai et al.

It is certified that error appears in the above-identified patent and that said Letters Patent is hereby corrected as shown below:

On the title page item (30), Foreign Application Priority Data information is incorrect. Item (30) should read:

-- Foreign Application Priority Data

Nov. 12, 2010 (JP)................. 2010-254173
Feb. 7, 2011 (JP)................. 2011-024190 --

Signed and Sealed this
Twenty-first Day of April, 2015

Michelle K. Lee
*Director of the United States Patent and Trademark Office*